United States Patent
Howard et al.

(10) Patent No.: US 9,142,496 B1
(45) Date of Patent: Sep. 22, 2015

(54) SEMICONDUCTOR PACKAGE HAVING ETCHED FOIL CAPACITOR INTEGRATED INTO LEADFRAME

(71) Applicant: Texas Instruments Incorporated, Dallas, TX (US)

(72) Inventors: Gregory E. Howard, Plano, TX (US); Bernardo Gallegos, McKinney, TX (US); Rajiv Dunne, San Diego, CA (US); Darvin R. Edwards, Garland, TX (US); Siva P. Gurrum, Allen, TX (US); Manu J. Prakuzhy, Allen, TX (US); Donald C. Abbott, Chartley, MA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/444,370

(22) Filed: Jul. 28, 2014

(51) Int. Cl.
*H01L 21/00* (2006.01)
*H01L 23/495* (2006.01)
*H01L 21/78* (2006.01)
*H01L 21/56* (2006.01)
*H01L 21/48* (2006.01)

(52) U.S. Cl.
CPC ...... *H01L 23/49589* (2013.01); *H01L 21/4825* (2013.01); *H01L 21/4828* (2013.01); *H01L 21/561* (2013.01); *H01L 21/78* (2013.01); *H01L 23/4952* (2013.01); *H01L 23/49503* (2013.01)

(58) Field of Classification Search
CPC ........... H01L 2224/48091; H01L 2924/01079; H01L 27/14618
USPC .................. 438/107, 110; 257/678
See application file for complete search history.

(56) References Cited

U.S. PATENT DOCUMENTS

| | | | |
|---|---|---|---|
| 7,553,695 B2 * | 6/2009 | Shiv et al. ............ | 438/107 |
| 8,187,740 B2 * | 5/2012 | Nathan et al. ........ | 429/129 |
| 2006/0210234 A1 * | 9/2006 | Shiv et al. ............ | 385/147 |
| 2009/0065767 A1 * | 3/2009 | Reynolds et al. .... | 257/40 |
| 2009/0114908 A1 * | 5/2009 | Hirai et al. ........... | 257/40 |
| 2009/0142656 A1 * | 6/2009 | Nathan et al. ........ | 429/129 |

* cited by examiner

*Primary Examiner* — Jami M Valentine
(74) *Attorney, Agent, or Firm* — Steven A. Shaw; Frank D. Cimino

(57) ABSTRACT

A method for fabricating a packaged semiconductor device begins by placing a first mask on a foil of porous conductive material bonded on a strip of a first metal. The surface of the conductive material and the inside of the pores are oxidized. The first mask leaves areas unprotected. The pores of the unprotected areas are filled with a conductive polymeric compound. A layer of a second metal is deposited on the conductive polymeric compound in the unprotected areas. The first mask is removed to expose un-oxidized conductive material. The foil thickness of the un-oxidized conductive material is removed to expose the underlying first metal. This creates sidewalls of the foil and leaves un-removed the capacitor areas covered by the second metal. A second mask is placed on the strip, the second mask defines a plurality of leadframes having chip pads and leads, and protecting the capacitor areas. The portions of the first metal exposed by the second mask are removed. Sidewalls of the first metal are coplanar with the foil sidewalls. The second mask is removed.

4 Claims, No Drawings

SEMICONDUCTOR PACKAGE HAVING ETCHED FOIL CAPACITOR INTEGRATED INTO LEADFRAME

FIELD

The present invention is related in general to the field of semiconductor devices and processes, and more specifically to the structure and fabrication method of semiconductor packages with leadframes, which start their fabrication process with etched foil capacitors so that an arbitrary number of these capacitors can be integrated into a package.

DESCRIPTION OF RELATED ART

Among the components of electronic systems assembled on printed circuit boards are typically capacitors of various sizes. To save board space and reduce parasitics, these capacitors are often placed as piece parts in tight proximity to other board components such as transistors and inductors. Driven by the relentless trend to conserve board real estate and minimize parasitic resistances, these capacitors are sometimes placed under or on top of other components.

As an examples of an additional step to advance conservation, stacked chip power MOSFETs have recently been proposed, which integrate a capacitor into the package of the device. Other semiconductor devices in Quad Flat No-Lead (QFN) and Small Outline No-Lead (SON) packages also are beginning to employ capacitors as piece parts inside the semiconductor package. In most cases, the semiconductor package offers only enough space for a single capacitor unit, for example in a 32 pin, 0.5 mm pitch, wire-bonded and molded 4×4×1 mm QFN package with a 200 µm thick leadframe.

To increase the obtainable value of capacitance per area by at least one order of magnitude, capacitors have recently been demonstrated based on the concept of folding the third dimension into the area of two dimensions: Cavities are etched into metal boards made for instance of aluminum, the aluminum surface in the cavities is then oxidized, and the cavities are filled with a conductive material such as a polymeric compound. After applying contact to the conductive compound, the three-dimensional capacitor offers a high capacitance value.

SUMMARY

Applicants realized that the market trend for many products using semiconductor devices, especially those in small, leadframe-based packages such as QFN and SON, requires a plurality of capacitors in intimate proximity to the semiconductor device. However, the traditional fabrication flow to start with a strip of base metal (typically copper), then masking the strip to etch it for multiple leadframes, and finally processing the strip through the steps of attaching a chip, bonding the wire connections, molding the package, and singulating the device, leaves only the option of assembling one or few discrete capacitors inside the package, while a multitude of additional needed capacitors has to be placed as piece parts on the board in the neighborhood of the device. This approach accumulates parasitic resistances and cost.

Applicants solved the problem of integrating an arbitrary number of capacitors, even with high capacitance values, inside the package directly in the locations of electrical need, when they discovered a process flow which reverses the conventional process flow and simultaneously integrates the capacitors with the leadframe: In the first phase, foil capacitors are formed and patterned, and in the second phase, the leadframe is patterned. The capacitors may be formed from aluminum foil, and the leadframe may be copper; each of the package pins and wire bond zones may also be aluminum. The process steps of attaching the chip, wire bonding the electrical connections, overmolding chip, wires and capacitors, and singulating the device remain unchanged.

The process flow begins with an aluminum foil (about 200 µm thick) bonded to a strip of copper sheet. Pores are created in the aluminum by etching. A first mask placed on the porous aluminum leaves the areas of the future capacitors unprotected. Next, the unprotected surfaces are oxidized, the pores are filled with conductive polymeric compound, and a contact metal such as silver is deposited on the compound. After removing the first mask, the now freed-up aluminum is removed so that the underlying copper is exposed. A second mask placed on the strip defines a plurality of leadframes. After the copper portions left exposed by the second mask are removed, the second mask is removed again.

DETAILED DESCRIPTION OF THE PREFERRED EMBODIMENTS

Embodiments of the invention realized by a semiconductor device of the Quad Flat No-Lead (QFN) or Small Outline No-Lead (SON) family. It should be stressed, however, that the usage of etched foil capacitors according to the invention has applications not only in leadless devices but in a huge field of semiconductor devices and substrates. The device created by an exemplary embodiment has square shape with a length of side of 2 mm and a height of the molded package of 0.5 mm. The package includes molding compound, which is preferably an epoxy-based thermoset compound with at least 80% inorganic fillers; for clarity and explanatory reasons, the molding compound is assumed to be transparent.

Inside the molded package a leadframe made preferably by etching from a strip of a first metal in the preferred range of thickness from about 0.15 mm to 0.25 mm. Preferred metals include copper, copper alloys, aluminum, iron-nickel alloys, and Kovar™. The leadframe includes a chip pad and a plurality of leads generally designated; chip pad is coupled to leads by straps. Each of these structures has a surface and a plurality of sidewalls, some sidewalls are inside the package, other sidewalls may be at the package periphery. For instance, the pad has a surface and a sidewalls inside the package and a sidewall at the package periphery.

Bonded to the surfaces of portions of pad, leads, or straps are one or more capacitors formed of geometrically shaped foils made of conductive material. As an example of the electrical characteristic of a foil capacitor, with an area of about 150 µm by 300 µm, a foil capacitor has a capacitance of about 25 nF. The conductive materials are preferably selected from a group comprising aluminum, tin, doped silicon, and doped germanium. The foil has a thickness preferably between about 40 and 60 µm. Among the preferred methods of bonding the foil of conductive material to the surfaces of the first metal are gluing with a conductive adhesive and electroless resistive welding; another method is growing the foil directly on the first metal surface by chemical vapor deposition. Processes to form foil capacitors 120 are discussed below. In the example of capacitor, the size of the capacitor is about 150 µm×300 µm; it may cover only a portion of the available surface of a lead; in other embodiments, it may cover all of the available surface area.

Certain sidewalls of the foil capacitors are coplanar with sidewalls of the bonded leadframe structure. As an example, the sidewall of capacitor is coplanar with sidewall of lead. The coplanarity of the sidewalls originates from the fabrication processes used in the manufacture of the leadframe and the capacitors; see below.

As mentioned, capacitors belong to a class of capacitors made from a sheet made of conductive material such as aluminum in the thickness range from about 25 to 50 μm. The fabrication process of the capacitors starts by subjecting the sheet to a process involving abrasive ionic bombardment or selective chemical etching (for instance by hydroxide), in which a high number of irregularly shaped cavities or pores are created. In a follow-up process step, the surfaces of the porous conductive material, including the inside of the pores, are oxidized in order to create the insulating layer for the capacitor. The pores are then filled with a conductive polymeric compound. A thin graphite layer is placed on the polymer layer, and a thin layer of a second metal such as silver is deposited on the graphite layer as a capacitor electrode. The total thickness of the stacked layers of the foil capacitor is preferably between 50 and 70 μm. Foil capacitors as described can be commercially obtained by Kemet Company USA, Cresco, Pa.

In addition to the capacitors and the large capacitor, there are a plurality of capacitors with a variety of contours and in various positions of the leadframe. As an example, the leads in the package corners carry angularly shaped capacitors; as another example, the leadframe straps (which hold the chip pad to certain leads) have elongated capacitors. These additional capacitors may represent spare units ready to be contacted and integrated into the circuitry assembled in the package, when a different chip with more numerous bond pad needs to be assembled in an existing leadframe without wasting time in waiting for a freshly designed leadframe.

A chip pad of about 1 mm×1 mm area, onto which a semiconductor chip is attached may be made by an embodiment. Chip has a plurality of bond pads; bonding wires are attached to the bond pads to connect the chip terminals to the leadframe leads and the capacitors. Wires may be made of copper, aluminum, or gold. A chip is mounted on top of a large capacitor of 1 mm×1 mm area, from which the four corners have been removed for wire bonding reasons; each corner sized about 0.3 mm×0.3 mm (the corners allow stitch bonds to the first metal). In other embodiments, the chip is mounted directly onto the pad.

The placement technique advantage is brought about by the fabrication process in which the capacitors, already integrated with the leadframe metal, are processed in the earlier phases ahead of the leadframe definition and in the later phases in parallel with the leadframe processes.

A foil of a conductive material is bonded on the flat surface of a strip made of a first metal. Foil has a preferred thickness between about 40 μm and 60 μm; as the starting material of the capacitors, the conductive material is preferably aluminum, other choices include tin, doped polycrystalline silicon and doped polycrystalline germanium. Strip has a preferred thickness between about 150 μm and 250 μm; other embodiments may use thicker or thinner strips. Strip is large enough to include a plurality of leadframes. As the starting metal of the leadframes, the first metal may be copper, copper alloy, aluminum, iron-nickel alloy, or Kovar™. Among the preferred methods of bonding the foil of conductive material to the surfaces of the first metal are gluing with a conductive adhesive and electroless resistive welding; another method is growing the foil directly on the first metal surface by chemical vapor deposition.

By the next process step, foil is prepared so that a multitude of pores and cavities are created. A preferred method is selective chemical etching, for instance by hydroxide, another method includes abrasive ionic bombardment. The resulting porous metal has irregularly shaped cavities, indents and pores.

As an alternative method, the conductive material may be deposited on the first metal by plasma vapor deposition or a related process. Layers formed by such methods have been found to exhibit a multitude of pores and surface roughness useful for creating capacitors.

In the next process step, a first mask is placed on the foil of porous conductive material. First mask defines the areas of the capacitors. The openings in mask may define capacitors of a variety of different shapes, such as rectangles, crosses, angles, and circles.

The next process includes step of oxidizing the surface of the conductive material including the surface inside of the pores, exposed by mask; and the step of filling the pores of the areas exposed by mask with a conductive polymeric. The compound may form a layer over the conductive material with a thickness between about 20 μm to 40 μm.

The next process step includes depositing a top electrode on the conductive polymeric compound of the capacitor areas. The top electrode is made of a second metal. Preferably, the second metal is bondable to ball and stitch bonds. A preferred choice for the second metal is silver; alternatively, copper with an outermost layer of a bondable metal like palladium may be used.

When mask is removed, the porous conductive material of foil (un-oxidized material) is exposed next to the patterns of second metal. Protected by the second metal, the capacitor areas stay untouched, when, in the next step, the exposed porous conductive material is removed. The preferred removal technique is chemical etching, which is selected to specifically attack the porous conductive material. In this etching step, the complete thickness of foil is removed so that the underlying first metal becomes exposed. The areas of the capacitors, protected by the second metal, are elevated relative to the area of the exposed first metal. The sidewalls of the capacitors, composed of porous conductive material overlaid by conductive polymer and second metal, stand out from the flat surface plane of strip of the first metal.

In the next process step, a second mask is placed on the first and second metals exposed by the strip. Second mask defines the areas of the leadframe components. A second mask covers all areas of second metal and additional area portions of first metal, leaving only remaining portions of first metal exposed for removal. As for the sidewalls of many structures of mask, the mask sidewalls are coplanar with sidewalls of capacitors constituted by porous conductive material overlaid by conductive polymeric compound and second metal.

The step is removing the complete thickness of the first metal strip in areas exposed by second mask after removing second mask. The preferred method of removal is chemical etching, wherein the etchant is selected to specifically attack metal, which had been selected as leadframe metal. In the course of the etching process, the mask-protected areas become leadframe components, such as chip pad and leads. The leadframe components have sidewalls. Wherever the leadframe components are overlaid by capacitors under mask, the sidewalls of the leadframe components necessarily become coplanar with the sidewalls of the capacitors. For instance, a lead is overlaid by capacitor, which has a sidewall. Due to the masking and etching steps described above, lead sidewall is coplanar with capacitor sidewall. The etching step has not removed certain traces of metal, which, after removal of mask, become as saw streets between the plurality of leadframes.

Attaching a semiconductor chip on the second metal surface of the capacitor on the chip pad of the leadframe unit. Thereafter, spanning wires to connect chip terminals to respective leads of the leadframe and to bondable second metal surfaces of capacitors. Packaging chips, wires, and capacitors in an encapsulation compound, preferably a polymeric molding compound. Compound leaves the saw streets outside the polymeric package. In the final process step, the strip is sawed along the saw streets in order to singulate the packaged devices from the strip of first metal. Alternatively, a trimming step may be used to break the strip along the saw streets into discreet units.

While this invention has been described, this description is not intended to be construed in a limiting sense. Various modifications and combinations of the embodiments, as well as other embodiments of the invention, will be apparent to persons skilled in the art upon reference to the description. As an example, the invention applies not only to integrated circuits, but also to devices with any type of semiconductor chip. The invention also applies to devices without capacitor formed under the chip.

As another example, the method can be extended to capacitors of an arbitrary number and any geometrical shape. The capacitors may not be connected by bonding wires for a specific device type, but may be included in the circuitry for another device type using the same leadframe, thus avoiding any waiting time for leadframe redesign and delivery.

As another example, the capacitance value of capacitors may be modified by varying the process of creating the porous structure, thus allowing to use the same geometrical capacitor values yet with different capacitance values—an inexpensive way of using available package structures with different electrical values.

In yet another example, the metals, insulators, geometries and thicknesses of the capacitors can be selected as a function of the size of the chip so that specific product goals of the assembled package can be achieved such as final thickness, mechanical strength, minimum warpage, prevention of cracking, compatibility with pick-and-place machines, and minimum electrical parasitics.

It is therefore intended that the appended claims encompass any such modifications or embodiments.

We claim:

1. A method for fabricating a packaged semiconductor device comprising the steps of:

placing a first mask on a foil of porous conductive material, the foil having a thickness, the material bonded on a strip of a first metal, the surface of the conductive material and the inside of the pores being oxidized, the first mask leaving unprotected the areas of future capacitors;

filling the pores of the unprotected areas with a conductive polymeric compound;

depositing a layer of a second metal on the conductive polymeric compound in the unprotected areas;

removing the first mask to expose un-oxidized conductive material;

removing the foil thickness of the un-oxidized conductive material to expose the underlying first metal, creating sidewalls of the foil and leaving un-removed the capacitor areas covered by the second metal;

placing a second mask on the strip, the second mask defining a plurality of leadframes having chip pads and leads, and protecting the capacitor areas;

removing the portions of the first metal exposed by the second mask, thereby creating sidewalls of the first metal coplanar with the foil sidewalls, and removing the second mask.

2. The method of claim 1 further including the steps of:

attaching a semiconductor chip having terminals on the chip pad of each leadframe;

spanning wires to connect the chip terminals to respective leads;

packaging chips, wires, and capacitors in an encapsulation compound; and singulating the packaged devices from the strip of first metal.

3. The method of claim 2 further including, prior to the step of placing a first mask, the steps of:

bonding a foil of conductive material on a strip of a first metal;

creating pores in the foil of conductive material; and oxidizing the surface of the conductive material including the inside of the pores.

4. The method of claim 2 further including, prior to the step of placing a first mask, the steps of:

providing a foil of conductive material having pores; and bonding the foil on a strip of a first metal.

* * * * *